US005608684A

United States Patent [19]
Reasoner et al.

[11] Patent Number: 5,608,684
[45] Date of Patent: Mar. 4, 1997

[54] SYSTEM AND METHOD FOR RAM POWER AND DATA BACKUP UTILIZING A CAPACITOR AND ROM

[75] Inventors: Kelly J. Reasoner; Eric E. Williams, both of Ft. Collins, Colo.

[73] Assignee: Hewlett-Packard Company, Palo Alto, Calif.

[21] Appl. No.: 322,808

[22] Filed: Oct. 13, 1994

[51] Int. Cl.$^6$ .................................................... G11C 7/00
[52] U.S. Cl. ......................... 365/228; 365/149; 365/154; 365/226
[58] Field of Search .................................. 365/226, 102, 365/149, 222, 228, 154

[56] References Cited

U.S. PATENT DOCUMENTS

| | | | |
|---|---|---|---|
| 4,348,729 | 9/1982 | Sasayama et al. | 365/228 X |
| 4,399,524 | 8/1983 | Muguruma et al. | 365/228 X |
| 4,874,960 | 10/1989 | Cybela | 307/64 |
| 5,175,842 | 12/1992 | Totani | 365/228 X |
| 5,206,938 | 4/1993 | Fujioka | 365/228 X |
| 5,243,577 | 9/1993 | Ueda et al. | 365/228 X |
| 5,375,246 | 12/1994 | Kimura et al. | 365/226 X |

OTHER PUBLICATIONS

NEC Document No. CEP–1004G, "Supercap" User's Manual, published Jun. 1992.

*Primary Examiner*—Do Hyun Yoo

[57] ABSTRACT

A system and method for permanently backing up RAM memory devices. The present invention utilizes a capacitor as a primary backup device for supplying the necessary backup power for power fluctuations, power interruptions, and other short-duration power failures. The present invention also utilizes a ROM as a secondary backup device for backing up and restoring valid RAM data when the duration of power loss is greater than that for which the capacitor can supply backup power. Thus, the integrity of RAM data is guaranteed for all types of power fluctuations, interruptions, and failures. The ROM includes two storage areas for separately storing two copies of RAM data. The processor first determines whether the data stored in the RAM is valid. If the present RAM data is valid, the processor backs up the present RAM data by replacing the oldest or invalid copy in the ROM with the present RAM data. If the present RAM data is not valid, the processor restores the RAM data with the most recent valid data previously stored in the ROM.

4 Claims, 4 Drawing Sheets

SYSTEM AND METHOD FOR RAM POWER AND DATA BACKUP UTILIZING A CAPACITOR AND ROM

BACKGROUND OF THE INVENTION

1. Field of the Invention

The present invention relates generally to maintaining a supply of electrical power to electronic components normally furnished from a line supply of electrical power, and more particularly, to maintaining data stored in volatile memory components for which electrical power has been interrupted or lost.

2. Related Art

Volatile memory components such as a random access memory (RAM) must receive electrical power continuously to maintain the information stored in their memory cells. The bit content of the memory is typically lost whether electric power to the RAM is momentarily interrupted, fluctuates, or is lost.

There are many situations where backup power is required to maintain data in RAM. For example, service interruptions to the line source of power by natural phenomenon, operational problems in the power system, etc. These conditions generally result in a power interruption for a short period of time, perhaps one hour or less. Power backup is also required for momentary power fluctuations which may occur when, for example, heavy loads such as motors, buzzers, or displays are driven. Under such conditions, the backup power source is necessary to maintain a stable source of power. Other situations include providing backup power when the primary power source is turned off. Under these conditions, backup power may be required for an extended period of time, such as one month.

Recently, various approaches have been taken towards providing power backup capability to RAMs to achieve a nonvolatile memory, isolated from the above power interruptions and fluctuations. One of the more common backup power supply arrangements has been to combine a RAM with a dedicated backup battery. Some of these battery backup devices also include a circuit which senses power supply voltage. If this voltage drops below a predetermined battery voltage level, the circuit switches the RAM from receiving power from the line source of power to receiving power from the backup battery. These circuits generally allow current to be drawn from the battery only in the event of a loss of AC power.

There are a number of problems with the above approaches. First, the circuits normally exhibit a time delay before the backup battery is connected to the RAM. This time delay is a result of the turn-on time of the transistors in the circuit. While the delay time is relatively short, the RAM can be exposed to a low supply voltage condition before the battery is connected. This exposure to low supply voltage may cause a loss of data. Some systems have incorporated a capacitor to supply a temporary source of power to the RAM during the switching of power from line voltage to battery.

Another disadvantage of a battery backup power supply is that the charge remaining in nonrechargeable batteries to handle a power outage of unknown duration are difficult to determine. In addition, rechargeable batteries must have a controlled charge rate to limit current to the battery, and periodically requires replacement. This increases the maintenance cost of the system. In addition, the capacitor can supply the necessary voltage for only a limited period of time. Thus, there may be a loss of data should the battery not be replaced at the proper time or is defective for a period longer than the discharge time of the capacitor.

Another disadvantage of battery backup systems relates to the environmental concerns of used battery disposal. Battery backup systems require the implementation of procedures for removing and discharging the battery prior to disposal. Although the use of a capacitor alone to provide backup power would alleviate this environmental problem, capacitors can supply power for only a relatively short period of time, making them ineffective as a long term backup power source.

What is needed, therefore, is a means for backing up volatile memory devices for long periods of time without incurring the problems associated with the use of batteries.

SUMMARY OF THE INVENTION

The present invention is system and method for indefinitely backing up RAM memory devices. The present invention utilizes a capacitor as the primary backup device for supplying the necessary backup power for power fluctuations, power interruptions, and other short-duration power failures. The present invention utilizes a ROM as a secondary backup device for backing up and replacing valid RAM data when the loss of line power supply is of a duration greater than that for which the capacitor can supply backup power. Thus, the present invention guarantees the integrity of RAM data for all types of primary power fluctuations, interruptions, and failures.

More specifically, the present invention includes a RAM configured to store binary data, a capacitor configured to provide the RAM with a voltage for a first period of time sufficient for the RAM to maintain the data stored in its memory cells, a ROM configured to store multiple backup copies of RAM dam, and a processor for controlling the data transfers and copies stored in the RAM and ROM.

The processor first determines if the data presently stored in the RAM is valid. Typically, the RAM data is valid unless the line source power supply has been unavailable for a time which is greater than a discharge time of the capacitor. If the data stored in the RAM is valid, the processor backs up (copies) the RAM data to ROM. The ROM includes two storage areas for storing copies of RAM data. In the back up process of the present invention, the processor determines which of the copies of RAM data is the most recent and valid copy. The processor then replaces the older or invalid copy with the data presently stored in the RAM. If the RAM data is not valid, the processor restores the RAM data with the most recent valid data previously stored in the ROM. This restoring process includes first determining which copy of RAM data stored in ROM is the most recent valid copy. Then the processor replaces the corrupted data stored in the RAM with the most recent valid copy of RAM data stored in ROM.

One advantage of the present invention is that it completely eliminates the use of a battery as a source of backup power to volatile RAM.

Another advantage of the present invention is that it uses a capacitor to provide relatively short term backup power. This enables the present invention to respond quickly to power interruptions. In addition, the capacitor protects against power fluctuations, thereby achieving greater circuit stability.

Another advantage of the present invention is that it utilizes an extremely high capacitance capacitor in conjunction with a ROM data backup system. The ROM provides long term data backup power for conditions in which the capacitor cannot maintain the necessary voltage output. The use of a high capacitance capacitor with a RAM enables the ROM to be used only in the rare circumstances wherein the power is removed from the system for long periods of time. This results in the ROM not being written to often, thereby preserving the ROM and enabling the present invention to guarantee RAM data indefinitely.

Further features and advantages of the present invention as well as the structure and operation of various embodiments of the present invention are described in detail below with reference to the accompanying drawings. In the drawings, like reference numbers indicate identical or functionally similar elements. Additionally, the left-most digit of a reference number identifies the drawings in which the reference number first appears.

BRIEF DESCRIPTION OF THE FIGURES

The invention is best understood by reference to the Figures wherein references with like reference numbers indicate identical or functionally similar elements. In addition, the left-most digits refer to the figure in which the reference first appears in the accompanying drawings in which.

DETAILED DESCRIPTION OF THE PREFERRED EMBODIMENTS

I. Introduction

The present invention is a system and method for permanently backing up RAM memory devices. The present invention utilizes a capacitor as a primary backup device for supplying the necessary backup power for power fluctuations, power interruptions, and short-duration power failures. The present invention utilizes a ROM as a secondary backup device for backing up valid RAM data and replacing invalid RAM data. For instance, when the loss of line source power is for a time greater than that for which the capacitor can supply backup power, RAM data will be lost. Thus, the present invention guarantees the integrity of RAM data for all types of line source power fluctuations, interruptions, and failures.

II. System Architecture

Figure 1:
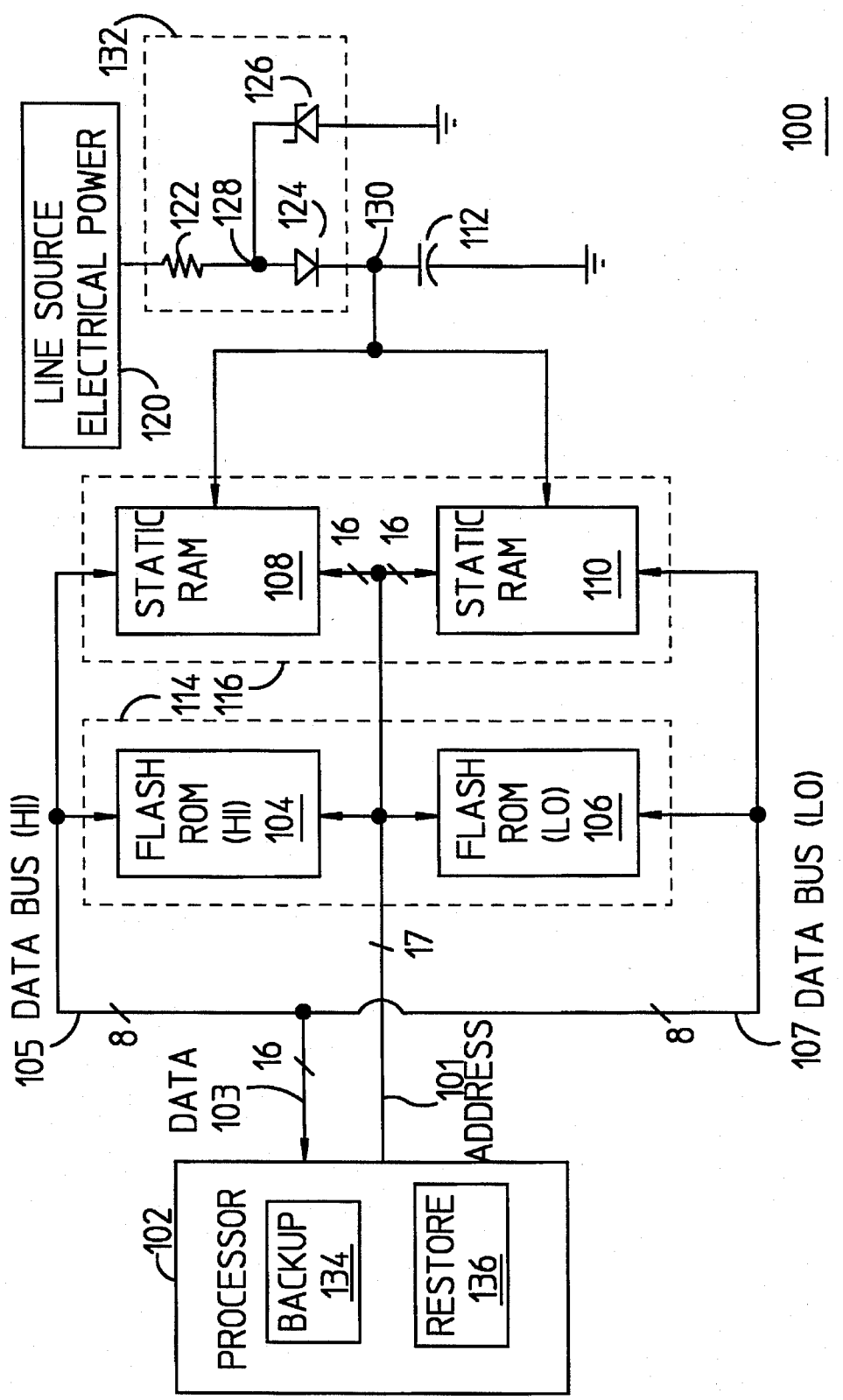
FIG. 1 is a circuit block diagram of a preferred embodiment of the RAM power and data backup system of the present invention.

FIG. 1 illustrates a circuit block diagram of a preferred embodiment of the memory backup system of the present invention. Referring now to FIG. 1, a memory backup system 100 of the present invention principally comprises a processor 102, a ROM 114, a RAM 116, a capacitor 112, and a power supply circuit 132. These components work in conjunction with each other to permanently maintain and backup data stored in RAM 116.

As will be discussed in detail below, ROM 114 consists of two separate ROM devices 104 and 106 to accommodate the multiple "flash copy" approach of the present invention. The two ROM devices 104 and 106 are addressed by processor 102 via address bus 101. Address bus 101 has 17 address lines, all of which are used to address ROM device 104 and ROM device 106. Processor 102 transfers data to and from ROM 114 over data bus 103. Data bus 103 has 16 data lines as illustrated in FIG. 1. The 16 data lines of data bus 103 are divided into 8 high order data lines, represented by high data bus 105, and 8 low order data lines, represented by low data bus 107. The 8 high order data lines are used to transfer data to and from ROM device 104. The 8 low order data lines are used to transfer data to and from ROM 106.

RAM 116 interfaces with processor 102 in a manner similar to ROM 114. RAM 116 consists of two separate RAM devices 108 and 110. However, as will be discussed in detail below, this division of RAM 116 is of little consequence in the present invention. In any event, the two RAM devices 108 and 110 are addressed via 16 of the 17 address lines of address bus 101. Processor 102 and RAM device 108 transfer data over high data bus 105. Processor 102 and RAM device 110 transfer data over low data bus 107.

RAM 116 receives power from a line power source 120 through power supply circuit 132. In the preferred embodiment of the present invention, RAM devices 108 and 110 are complimentary metal oxide silicon (CMOS) random access memory (RAM) components. These CMOS RAM components operate at 5 volts and retain stored information for extended periods of time at voltages down to 2 volts. Line power source 120 is a 12 volt source of power. Power supply circuit 132 receives the 12 volt line power, and converts that 12 volt power to 5 volts. Power supply 120 provides power to RAM 116 through resistor 122 and diode 124. A zener diode 126 is coupled to the power source side of diode 124. Zener diode 126 is employed as a voltage reference, maintaining a voltage of 5.6 volts at junction 128. Since the voltage drop across diode 124 is 0.6 volts, the voltage at junction 130 is maintained at 5 volts. Resistor 122, diode 124, and zener diode 126 are collectively and generally referred to as power supply circuit 132. The preferred embodiment of the present invention is implemented in a system having a 12 volt line voltage. Thus, power supply circuit 132 is directed towards reducing the 12 volt line voltage to the 5 volts required by CMOS RAM devices 108 and 110. However, as one skilled in the relevant art would find apparent, the configuration of power supply circuit 132 depends upon supply 120 and the power requirements of RAM 116, and may accordingly take on different configurations.

Coupled to power supply circuit 132 and RAM 116 at junction 130 is a capacitor 112. Capacitor 112 is charged by voltage source 120 through resistor 122 and diode 124. Capacitor 112 discharges when the voltage at junction 130 drops below 5 volts. Diode 124 prevents the charge stored in capacitor 112 from flowing to voltage source 120 when discharging to drive the remaining portions of the system (not shown). Thus, capacitor 112 supplies power only to RAM 116.

Further details regarding the system architecture and components are discussed with respect to the operation of the present invention. As introduced above, the present invention provides both power backup as well as data backup for RAM 116. Each of these processes and associated components are discussed below.

A. Power Backup Components

The components associated with the power backup feature of the present invention are now described in further detail. These components include power supply circuit 132 and capacitor 112.

As described above, normal line power is supplied by line source power supply 120 through power supply circuit 132. In addition, power supply 120 simultaneously charges capacitor 112 while providing power to RAM 116. In the event of a loss or interruption of normal line power at line source 120, capacitor 112 will discharge to supply the necessary voltage to enable RAM 116 to maintain data stored in its memory cells.

As introduced above and discussed in detail below, the power backup feature of the present invention is utilized in conjunction with a ROM. However, the ROM components cannot be written too often (also discussed below). Thus, it is desired for capacitor 112 to have the capability to maintain the necessary voltage at junction 130 for RAM 116 to maintain the stored data for as long as possible.

In the preferred embodiment of the present invention, capacitor 112 is a 0.22F SUPERCAP, available from NEC Electronics, Inc., Mountain View, Calif., U.S.A. Due to its large capacity of 0.22F, capacitor 112 has a discharge time of a minimum of 10 days when supplying power to CMOS RAM 116. Thus, when there is a power interruption or failure for 10 or more days, capacitor 112 will supply the necessary power to preserve data in RAM 116, and ROM 114 will not have to utilized. Further details regarding the NEC SUPERCAP capacitor 112 may be found in SUPERCAP User Manual, Document No. DEP-10046 (also available from NEC Electronics, Inc., Mountain View, Calif., U.S.A.), herein incorporated by reference in its entirety.

As introduced above, in the preferred embodiment of the present invention, capacitor 112 is a 0.22F SUPERCAP available from NEC. However, as one skilled in the relevant art would find apparent, any high capacitance capacitor may be used which is compatible with the anticipated duration of power interruptions which may occur. If the capacitance of capacitor 112 is too low, then ROM 114 will be utilized more often. Thus, if there are few long-term power interruptions, ROM 116 will still not be utilized often.

B. Data Backup Components

The system components directed to the backup and restoration of valid RAM data are now discussed. In particular, ROM 114 with ROM device 104 and ROM device 106 are provided to store copies of valid RAM data in the event that power is removed for a time greater than that for which capacitor 112 can supply backup power. The copying of RAM data and the transferring of data between processor 102 and RAM 116 and ROM 114 is performed by processor 102. More specifically, there are two functional components of processor 102 associated with the present invention: a backup subprocessor 134 and a restoration subprocessor 136. Backup subprocessor 134 backs up valid RAM data by copying it to ROM. A restoration subprocessor 136 restores RAM data which was previously backed up by backup subprocessor 134 to replace corrupted data stored in RAM 116.

As introduced above, ROM 114 is comprised of two ROM devices 104 and 106. Each of these are configured to store a copy of RAM data, referred to as a "flash copy." Thus, in the preferred embodiment, two copies of RAM data are maintained in ROM 114.

ROM 114, like all read-only memory components, is limited in the number of write cycles that it can support. This is typically on the order of a hundred thousand times. Thus, to extend the life of ROM 114, the present invention writes RAM data to ROM only at particular times and under certain conditions. Specifically, RAM data is copied to ROM 114 at power up when the validity of the RAM data has been verified. One copy is the latest copy of RAM data as of the time that the system receives line power from line source power supply 120. The other copy is an older version of RAM data which is held for the unlikely event of a power interruption during the copying of data into ROM 114. Under such conditions, the more recent backup copy which was in the process of being copied to ROM 114 may have become corrupted or may be incomplete. The flash copy which is the older version of RAM data may then be used as a backup copy.

In the preferred embodiment of the present invention, flash ROM devices 104 and 106 are Intel 28F001BX-T/-B CMOS Flash Memory, available from Intel Corp., Santa Clara, Calif., U.S.A. CMOS flash ROM device 104 and CMOS flash ROM device 106 are nonvolatile flash memory comprised of four separately erasable blocks. In addition, each block is capable of being reprogrammed separately to ensure data integrity. The blocking scheme allows logical segmentation of the embedded software, with an 8 Kbyte block for boot code, a 112 Kbyte block and a 4 Kbyte block, combined to store the code associated with backup subprocess 134 and restore subprocess 136, and another 4 Kbyte block for storing critical data. In the preferred embodiment of the present invention, the critical data is parametric data, such as odometers, configurations, and identify bits. Thus, ROM 114 is capable of separately storing two copies of RAM data, one in CMOS flash ROM device 104 and one in CMOS flash ROM device 106. However, as one skilled in the relevant art would find apparent, other types of read only memory may be used which have the capability of separately storing multiple copies of RAM data.

ROM devices 104 and 106 also comprise a powerdown mode to lock out erase or write operations during system power up or power loss to provide absolute data protection. Thus, after an initial powerup or after return from a long-term powerdown situation, ROM devices 104 and 106 function as standard read only memories. In addition, the blocking scheme of ROM devices 104 and 106 allows updates in the main and parameter blocks while providing recovery code in a boot block in the unlikely event of a power failure during update. Further features of ROM 114 may be found in Intel product literature for Pat. No. 28F001BX-T/28F001BX-B 1M (128K X 8) CMOS FLASH MEMORY, order no. 290406-002, available from Intel Corporation, Santa Clara, Calif., U.S.A.

In the preferred embodiment of the present invention, processor 102 is 68000 series Motorolla processor. However, as one skilled in the relevant art would find apparent, any other processor may be used which is configured to interface with ROM 114 and RAM 116 and which can perform the processing described below.

III. Data Backup Operation

Figure 2:
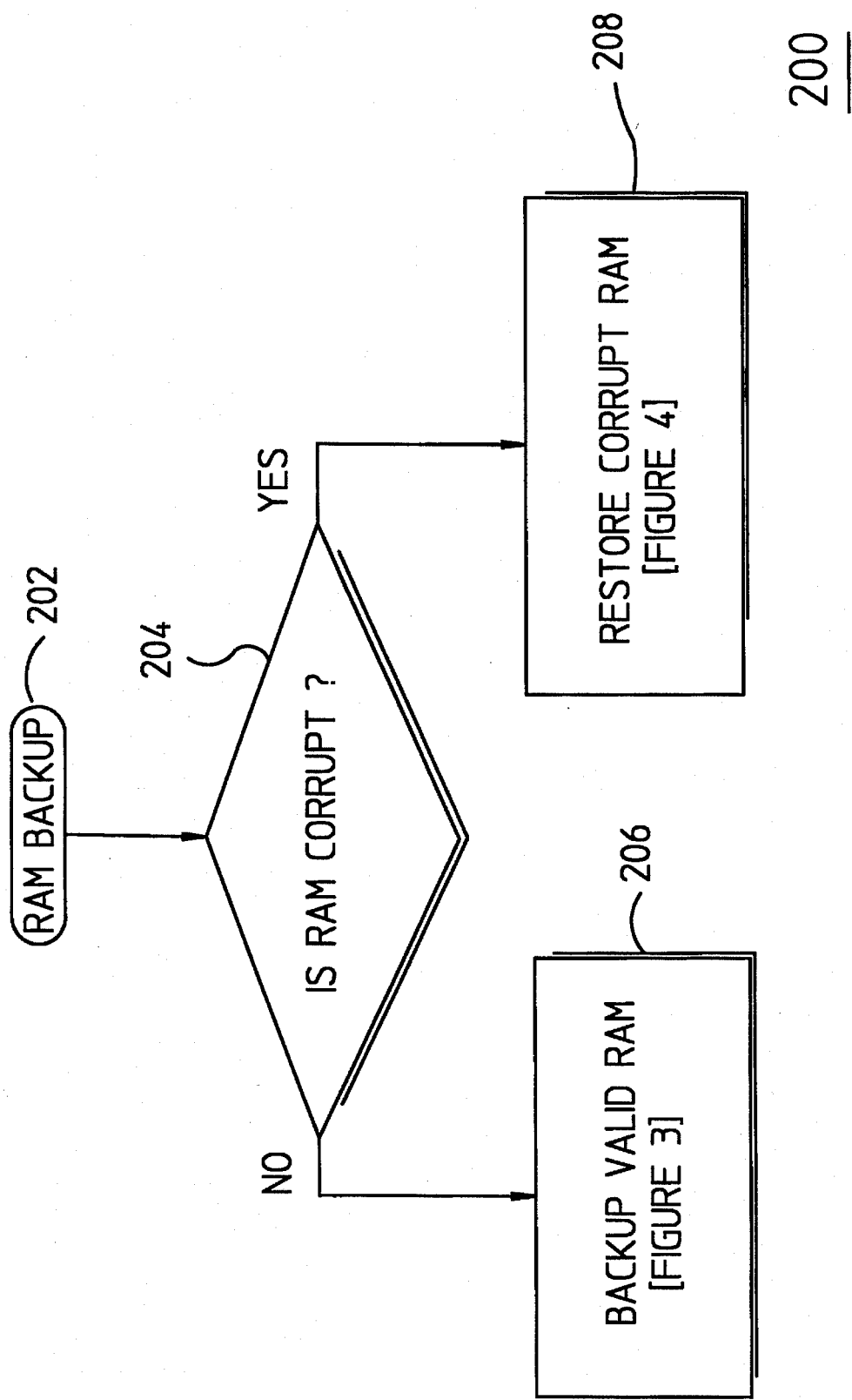
FIG. 2 is a high level flowchart of the operation of the RAM data backup process of the present invention.
Figure 3:
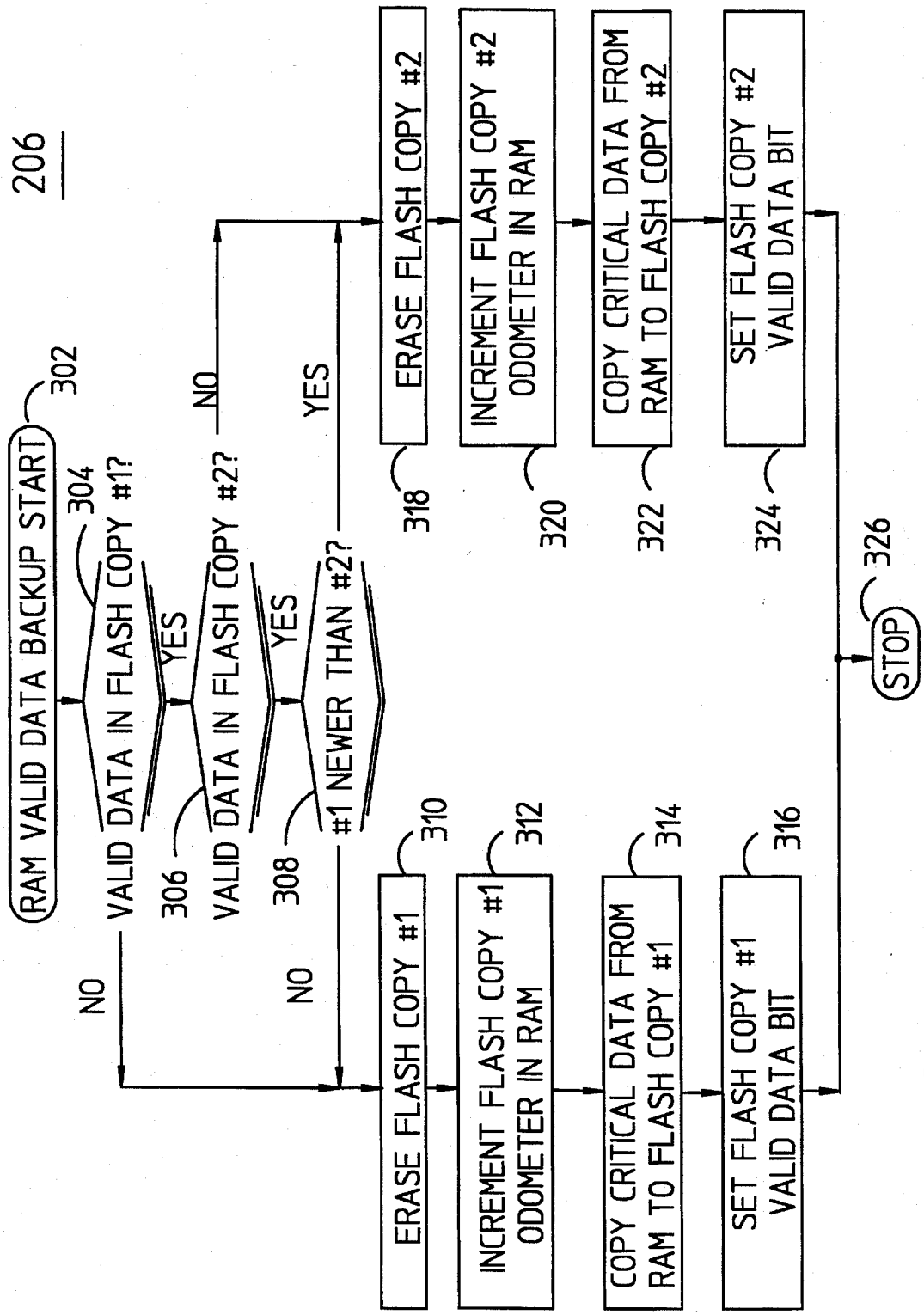
FIG. 3 is a flowchart of the portion of the RAM data backup process which copies valid RAM data to ROM.
Figure 4:
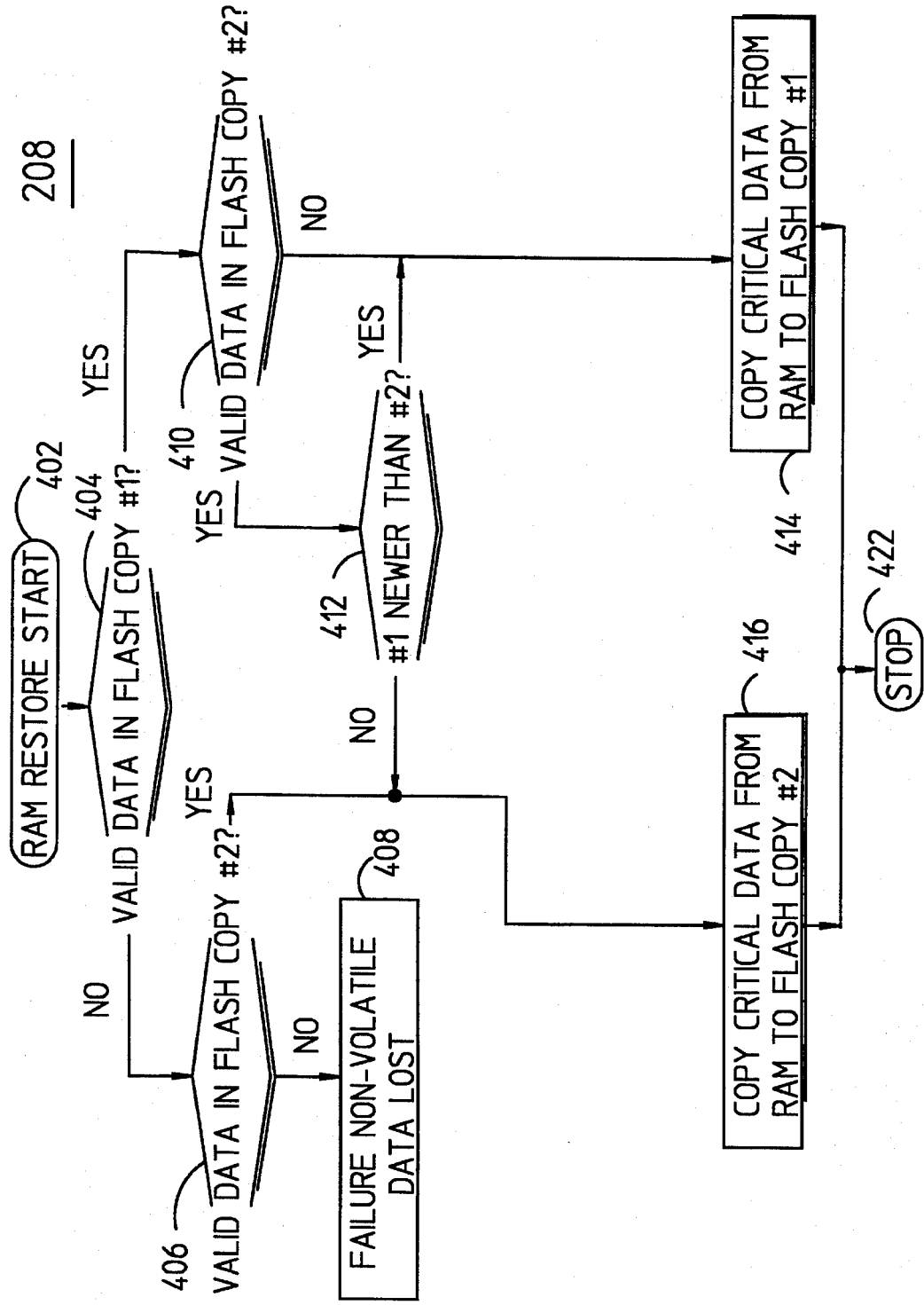
FIG. 4 is a flowchart of the portion of the RAM data backup process which copies previously stored RAM data from ROM back to RAM to replace data which has been found to be invalid.

FIGS. 2 through 4 are a flowchart of the RAM data backup and restoration process of the present invention. Referring to FIGS. 2–4, a preferred embodiment of the RAM data backup and restoration process is now discussed. The RAM data backup and restoration process 200 is invoked at start 202 when the system in which the present invention is implemented initially receives power.

First, in step 204, RAM 116 is verified to determine if it is corrupted. In the preferred embodiment of the present invention, this verification of the RAM data is accomplished by invoking a well known checksum operation. However, as one skilled in the relevant art would find apparent, other memory verification procedures may be used, depending on the particular application. Typically, in the present invention, RAM 116 would only be corrupted when backup capacitor 112 has discharged to a point beyond which it can no longer supply the minimum voltage of +2 volts to RAM 116.

If RAM 116 is not corrupt, then the RAM data backup and restoration process 200 continues at block 206 wherein a RAM backup subprocess 206 is performed. RAM backup subprocess 206 copies the contents of RAM 116 into ROM 114. This process is illustrated in FIG. 3 and discussed in detail below. If RAM 116 is found to be corrupted in step 204, then processing continues at block 208 with a RAM restoration subprocess 208. RAM restoration subprocess 208 replaces this invalid data by restoring RAM 116 with valid data which has been previously stored in ROM 114. This process is illustrated in FIG. 4 and discussed in detail below.

A. Backup of Valid RAM

Referring to FIG. 3, the RAM backup subprocess 206 of the present invention is now discussed. As discussed above, in the preferred embodiment of the present invention, RAM 116 is comprised of two separate RAM devices 108 and 110. As discussed above, this separation of RAM 116 is inconsequential to the design of the present invention and was chosen due to the availability of components presently existing in the system in which the present invention is implemented. Thus, RAM 116 contains data, the integrity of which is to be guaranteed. This data is referred to as critical data, and is stored in both RAM device 108 and RAM device 110.

RAM backup subprocess 206 begins at start block 302, at which point RAM 116 has been verified as containing valid data which is to be copied to ROM 114.

As discussed above, in the preferred embodiment of the present invention, ROM 114 is comprised of two separate ROM devices 104 and 106, each of which stores a copy of the critical data. As will be discussed in detail below, the flash copy which is stored in one ROM device is not the same as the flash copy stored in the other ROM device. For ease of description, the copy of RAM data stored in ROM device 104 will be referred to as flash copy 1 and the copy of RAM data stored in ROM device 106 will be referred to as flash copy 2. As noted above, ROM 116 may be comprised of a single ROM device. In such a case, the ROM device must have separately controllable portions, one configured to store flash copy 1 and the other configured to store flash copy 2. Other configurations of ROM 114 are considered to be within the purview of one skilled in the relevant art.

One function of RAM backup subprocess 206 is to determine which flash copy to replace with the data stored in the RAM. Another function of RAM backup subprocess 206 is to copy the critical RAM data from RAM 116 to the ROM device containing the selected flash copy which is to be replaced. Also, the present invention updates the status of the selected flash copy to indicate the changed status of the data contained in the ROM component which stores that flash copy.

First, in step 304, flash copy 1, located on ROM device 104, is checked to determine if it contains valid data. This is performed by checking an associated validity bit stored in one of the parameter blocks of the associated ROM device 104. If flash copy 1 does not contain valid data, then data which is stored in RAM 116 may be stored in ROM device 104 in place of the invalid data presently stored as flash copy 1 in ROM device 104. Thus, in step 310, flash copy 1 is erased. The odometer associated with flash copy 1 is incremented to indicate the processing point at which the RAM data is stored as flash copy 1. This is performed in step 312. After the data in flash copy 1 is erased and the odometer is incremented, the critical data stored in RAM 116 is copied to flash copy 1 in step 314. Finally, in step 316, a valid data bit associated with flash copy 1 is set to indicate that flash copy 1 now contains valid data.

If in step 304 it is determined that flash copy 1 contained valid data, then the above process of erasing flash copy 1 and replacing it with RAM data does not occur. Instead, processing continues at decision block 306, wherein a similar verification process is performed on flash copy 2.

If flash copy 2 does not contain valid data, then data which is stored in RAM 116 may be stored in place of flash copy 2. Thus, in step 318, flash copy 2 is erased. The odometer associated with flash copy 2 is incremented to indicate the processing point at which the RAM data is stored as flash copy 2. This is performed in step 320. After the data in flash copy 2 is erased and the odometer is incremented, the critical data stored in RAM 116 is copied to flash copy 2 in step 322. Finally, in step 324, a valid data bit associated with flash copy 2 is set to indicate that flash copy 2 now contains valid data.

If flash copy 1 and flash copy 2 both contain valid data, then the RAM data is copied to the flash copy containing the oldest version of data. Thus, since there are two separate flash ROMs to which RAM data may be copied, the RAM backup process 206 writes the copy of the critical data to the ROM device containing the oldest data.

In step 308 the backup subprocess 206 determines which flash copy contains the most recent version of RAM data. This step is performed by reading the associated odometers for each flash copy. If flash copy 2 is newer that flash copy 1, then flash copy 1 is erased and replaced with the critical data from RAM 116. This process was discussed above with reference to steps 310, 312, 314, and 316. Likewise, if flash copy 1 is newer that flash copy 2, then flash copy 2 is erased and replaced with the critical data from RAM 116. This process was discussed above with reference to steps 318, 320, 322, and 324.

Once the critical RAM data has been copied to ROM 114, the RAM backup subprocess 206 completes at block 326.

B. Restoration of Corrupted RAM

Referring to FIG. 4, the RAM restoration subprocess 208 is now discussed. RAM restoration subprocess 208 begins at start block 402, at which point RAM 116 has been verified as containing invalid data in step 204. Essentially, during RAM restoration subprocess 208 the latest valid flash copy stored in ROM 114 is copied to RAM 116 to replace corrupted data.

First, in step 404, the validity of the RAM data stored as flash copy 1 in ROM device 104 is verified. This is accomplished by reading an associated valid bit stored in a parameter block of ROM device 104. If flash copy 1 does not contain valid data, then that data cannot be used to replace the corrupted data presently stored in RAM 116. Thus, the validity of the RAM data stored as flash copy 2 is then verified in step 406. If flash copy 2 also does not contain valid RAM data, then there is no valid data available to replace the invalid RAM data. Processing continues at block 408 where a failure is indicated due to the loss of nonvolatile data.

If in step 404 restore subprocess 136 determines that flash copy 1 contains valid data, then processing continues at decision block 410 wherein the same verification process is performed on flash copy 2. If flash copy 2 does not contain valid data, then the critical RAM data stored as flash copy 1 in ROM device 104 is copied to RAM 116 in step 414.

If in step 404 restore subprocess 136 determines that flash copy 1 contains valid data and in step 410 restore subprocess 136 determines that flash copy 2 also contains valid data, then the most recent flash copy is selected to replace the corrupted data stored in RAM 116. Thus, in step 412, the odometer associated with flash copy 1 is compared with the odometer associated with flash copy 2 to determine which flash copy contains the oldest version of RAM data. If flash copy 1 is newer than flash copy 2, then processing proceeds to step 414 wherein the RAM data is copied to flash copy 1. Alternatively, if flash copy 2 is newer than flash copy 1, then processing proceeds to step 416 wherein RAM data is copied to flash copy 2. That is, restoration subprocess 206 of processor 102 copies the oldest flash copy of RAM data stored in ROM device 104 or 106 to RAM 116.

Thus, the present invention is capable of restoring the critical data stored in RAM 116 when it becomes corrupted. By maintaining two copies of the critical data in ROM 114, the present invention will restore the RAM with an older version of data which was backed up prior to the more recent version. Thus, the RAM will be restored to a known processing point from which the processing can be recovered.

Thus, the present invention maximizes the use of ROM 114 and capacitor 112 in their associated range of capabilities. Capacitor 112 is utilized often for "short term" (at least 10 days) power backup since it has the ability to be recharged repeatedly. ROM 114, on the other hand, is only utilized for the rare instances where "long term" data backup is required. In other words, there is a dual backup feature for maintaining valid RAM data; the first (capacitor) maintains the necessary RAM voltage to avoid the loss of data, and the second (ROM) restores the lost data when the capacitor fails to maintain the RAM voltage level.

Although the invention has been described and illustrated with a certain degree of particularity, it is understood that those of ordinary skill in the relevant art will recognize a variety of additional applications and appropriate modifications within the spirit of the invention and the scope of the claims.

What is claimed is:

1. A random access memory (RAM) backup system, comprising:

a RAM, configured to store binary data, including a supply voltage input adapted to receive a supply voltage thereon;

a capacitor, electrically coupled to said voltage input of said RAM, configured to provide said RAM with a voltage for a period of time, said voltage sufficient for said RAM to maintain said storage of said data;

a read only memory (ROM) having separate locations for concurrently storing multiple copies of said data stored in said RAM; and processing means, coupled to said RAM and said ROM, for transferring said copies of said data between said RAM and said ROM.

2. The system of claim 1, wherein said ROM stores a first copy and a second copy of said data stored in said RAM, and further wherein said ROM enables said first copy of said data to be stored and erased separately from said second copy of said data.

3. The system of claim 2, further comprising: a power supply circuit, interposed between said RAM and a line power source having a line voltage, configured to convert and maintain said line voltage to said supply voltage.

4. The system of claim 3, wherein said processing means comprises:

a backup processing means for copying said first copy and said second copy of said data in said RAM to said ROM; and a restore processing means for copying said first copy and said second copy of said data stored in said ROM to said RAM.

* * * * *